United States Patent [19]
Jeong

[11] Patent Number: 6,093,604
[45] Date of Patent: Jul. 25, 2000

[54] METHOD OF MANUFACTURING A FLASH MEMORY DEVICE

[75] Inventor: Hee Cheol Jeong, Chungcheongbuk-do, Rep. of Korea

[73] Assignee: LG Semicon Co., Ltd., Cheongju, Rep. of Korea

[21] Appl. No.: 09/026,550

[22] Filed: Feb. 20, 1998

Related U.S. Application Data

[62] Division of application No. 08/810,914, Mar. 5, 1997, Pat. No. 5,763,913.

[30] Foreign Application Priority Data

Aug. 21, 1996 [KR] Rep. of Korea ........................ 96/34657

[51] Int. Cl.⁷ .................................................. H01L 21/336
[52] U.S. Cl. .......................... 438/257; 438/182; 438/195; 438/211; 438/277; 438/283
[58] Field of Search ................................... 438/182, 257, 438/195, 211, 277, 283, 593, FOR 193, FOR 203, 179, 579; 257/316

[56] References Cited

U.S. PATENT DOCUMENTS

| | | | |
|---|---|---|---|
| 4,642,880 | 2/1987 | Mizutani et al. | 29/576 |
| 4,766,088 | 8/1988 | Kono et al. | 437/52 |
| 5,094,968 | 3/1992 | Schumann et al. | 438/264 |
| 5,523,969 | 6/1996 | Okazawa | 365/185.13 |
| 5,616,941 | 4/1997 | Roth et al. | 257/315 |
| 5,619,051 | 4/1997 | Endo | 257/316 |
| 5,621,233 | 4/1997 | Sharma et al. | 257/316 |
| 5,776,805 | 7/1998 | Kim | 438/182 |

FOREIGN PATENT DOCUMENTS

| | | |
|---|---|---|
| 2-72672 | 3/1990 | Japan . |
| 5-206472 | 8/1993 | Japan . |

OTHER PUBLICATIONS

Verma, G. and N. Mielke, "Reliability Performance of ETOX Based Flash Memories," Proc. IRPS, 1988, pp. 158–166.

*Primary Examiner*—Carl Whitehead, Jr.
*Assistant Examiner*—Maria Guerrero
*Attorney, Agent, or Firm*—Fleshner & Kim, LLP

[57] ABSTRACT

A memory device and a method of manufacturing the same in accordance with the present invention has an improved writing and erasing efficiency and an improved reliability. The memory device includes a first conductivity type substrate having second conductivity type source and drain regions spaced apart from each other. A source electrode having a T-shaped rail structure is formed in contact with the source region, and a drain electrode having a T-shaped rail structure is formed in contact with the drain region. An I-shaped floating gate is formed on the substrate between the source electrode and the drain electrode with a control gate formed on the floating gate.

17 Claims, 7 Drawing Sheets

METHOD OF MANUFACTURING A FLASH MEMORY DEVICE

This application is a Divisional of application Ser. No. 08/810,914 filed Mar. 5, 1997, now U.S. Pat. No. 5,763,913.

BACKGROUND OF THE INVENTION

1. Field of the Invention

The present invention relates to a semiconductor device, and more particularly, to a flash memory device and a method of making thereof.

2. Background of the Related Art

In general, a flash memory is an electrically erasable nonvolatile memory. FIGS. 1a and 1b are cross-sectional views of a general flash memory cell for illustrating writing and erasing operations. Initially, when applying a voltage to a control gate and a drain ($V_{CG}$>$V_D$, $V_D$≠0), no electrons exist in a floating gate. Electrons are attracted to a channel region between source and drain, so that a current begins to flow.

During programming, a hot electron injection method such is used for a conventional UV light erasing type electrically programmable read only memory (EPROM). As shown in FIG. 1a, a high voltage is applied to a control gate 25 in order to inject electrons created near a drain 28 of the memory cell into a floating gate 23. Accordingly, if electrons over a specified amount are injected into floating gate 23, a threshold voltage (Vth) of a memory cell transistor is raised. A high energy barrier is created to maintain a state where the electrons are accumulated in floating gate 23. Due to a difference of threshold voltages between an electron accumulated memory cell transistor and a memory cell transistor, in which no electron is injected, an information of "0" or "1" is distinguished.

In order for the information to be erased, the electrons accumulated in floating gate 23 are removed by Fowler Nordheim type tunneling current, and the threshold voltage of the memory cell transistor returns to the initial value. As shown in FIG. 1b, if a high voltage is applied to a source 27, the electrons accumulated in floating gate 23 are discharged to source 27 by Fowler Nordheim type tunneling mechanism through a part of a thin oxide film 22, where the source junction and floating gate 23 overlap with each other. The electrons of the floating gate are discharged to leave a positive (+) charge in the floating gate. Thus, the threshold voltage is lowered and the current flows smoothly in the channel region.

FIGS. 2a to 2f are cross-sectional views for illustrating a method of manufacturing the conventional flash memory. Initially, a tunneling oxide film 22 is deposited on a P-type silicon substrate 21 (FIG. 2a). Thereafter, a first polysilicon layer 23 is formed on a tunneling oxide film 22 (FIG. 2b). An interpoly dielectric layer 24 is formed on first polysilicon layer 23 (FIG. 2c), and a second polysilicon layer 25 is formed on interpoly dielectric layer 24 FIG. 2d).

A photoresist 26 is coated on second polysilicon layer 25 for the control gate and patterned by exposure and development process, as shown in FIG. 2e. Using patterned photoresist 26 as a mask, second polysilicon layer 25, interpoly dielectric layer 24, first polysilicon layer 23 and tunneling oxide film 22 are removed selectively to form the floating and control gates and the gate oxides. See FIG. 2f. Using second polysilicon layer 25 of the control gate as a mask, an impurity ion implantation is carried out to form source/drain impurity diffusion regions 27 and 28.

Programming of such flash memory is accomplished by injecting hot electrons created in the channel into floating gate 25. At this time, a ratio of a voltage applied to the floating gate with respect to a voltage applied to the control gate in order to form the channel is known as a coupling ratio. As such a coupling ratio becomes larger, the programming efficiency is increased.

To erase or discharge the electrons accumulated in the floating gate through Fowler Nordheim type tunneling mechanism, a positive (+) voltage is applied to source 27 of the deep junction. In order to improve the erasing efficiency, the thickness of tunneling oxide film 22 under floating gate 23 is made thin, and floating gate 23 and control gate 25 are formed of an N-type polysilicon. If a high voltage is applied to source 27 for the erasing operation, the energy band of tunneling oxide film 22 has a steep slope. Accordingly, the tunneling of electrons are attained through the thinned energy barrier part of tunneling oxide film 22 to realize the erasing operation.

However, the above conventional flash memory cell transistor has various problems. For example, during the writing operation, tunneling oxide film 22 is degraded due to hot electrons, thereby deteriorating the reliability. Further, in order to raise the erasing efficiency, the oxide film of the floating gate is utilized as the tunneling oxide film, thereby decreasing the writing efficiency. Moreover, an application of a high voltage is necessary to create the hot electron carriers.

The above references are incorporated by reference herein where appropriate for appropriate teachings of additional or alternative details, features and/or technical background.

SUMMARY OF THE INVENTION

It is an object of the present invention to solve the problems of the related art.

Another object of the present invention is to increase the reliability of memory cells.

A further object of the present invention is to increase the writing and erasing efficiency of memory cells.

Another object of the present invention is to operate a memory cell at a low applied voltage.

In order to accomplish the above objects in whole or in part, there is provided a memory device comprising a substrate of a first conductivity type having source and drain regions of a second conductivity type formed therein, spaced apart from each other, a source electrode having a T-shaped rail structure formed to be in contact with the source region, a drain electrode having a T-shaped rail structure formed to be in contact with the drain region, an I-shaped floating gate formed on the substrate between the source electrode and the drain electrode, and a control gate formed on the floating gate.

In order to accomplish the above object in whole or in part, there is provided a method of manufacturing a flash memory device comprising the steps of: forming a first insulating layer on a substrate of a first conductivity type; forming a second insulating layer on the first insulating layer; patterning the second insulating layer to form two open regions spaced apart from each other on the substrate; implanting an impurity in the substrate through the open regions to thereby form source and drain regions of a second conductivity type in the substrate; selectively removing the first insulating layer to expose the source and drain regions formed in the substrate; forming a semiconductor layer of the second conductivity type in contact with the source and drain regions, on the surface of the remaining first and second insulating layers and in the open regions; patterning the second conductivity type semiconductor layer to form source and drain electrodes of a T-shaped rail structure, and removing the remaining second insulating layer; forming a third insulating layer on the entire surface including the source and drain electrodes; forming a semiconductor layer of the second conductivity type on the third insulating layer; patterning the semiconductor layer such that a floating gate of an I-shaped rail structure which overlaps the source and drain electrodes; forming a fourth insulating layer on the entire surface including the floating gate; and forming and patterning a semiconductor layer on said fourth insulating layer to form a control gate the floating gate.

The invention may be also achieved in part or in whole by a semiconductor device comprising a substrate of a first conductivity type having first and second regions of a second conductivity type, first and second electrodes coupled to the first and second electrodes, respectively, at least one of the first and second electrodes having a first prescribed shape, a first gate insulatively formed between the first and second electrodes and insulated from the substrate, the first gate having a second prescribed shape such that portions of the first gate overlap at least one of the first and second electrodes, and a second gate formed insulatively on the first gate, wherein charge carriers are transferred between (1) at least one of the first and second electrodes and (2) the floating gate during least one of a programming operation and an erasure operation.

Further, the present invention may be achieved in whole or in part by a method of forming a semiconductor device comprising the steps of forming first and second regions in a substrate of a first conductivity type, the first and second regions being a second conductivity type, forming first and second electrodes coupled to the first and second regions; forming a first gate insulatively overlapping portions of the first and second electrodes, and forming a second gate insulatively overlapping the first gate.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
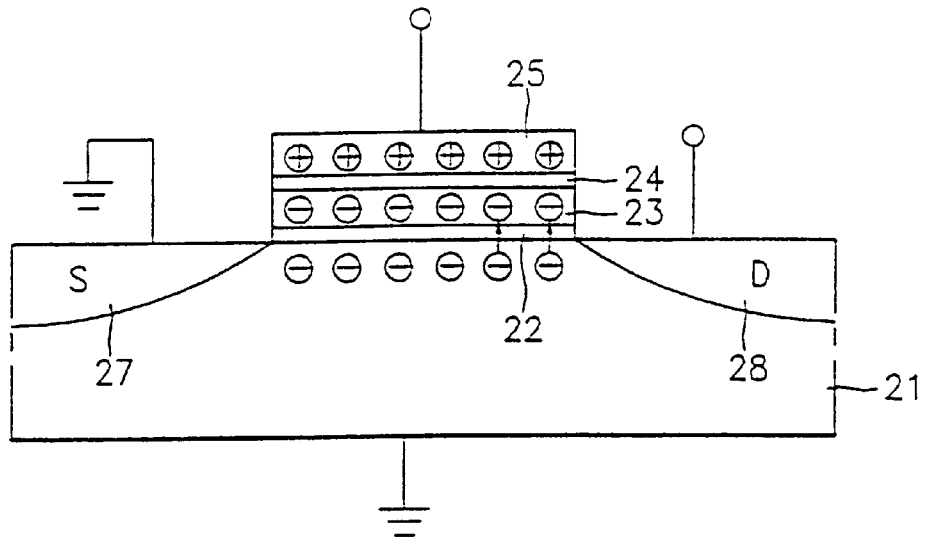
FIGS. 1a and 1b are cross-sectional views showing writing and erasing operations in a conventional flash memory device.
Figure 1B:
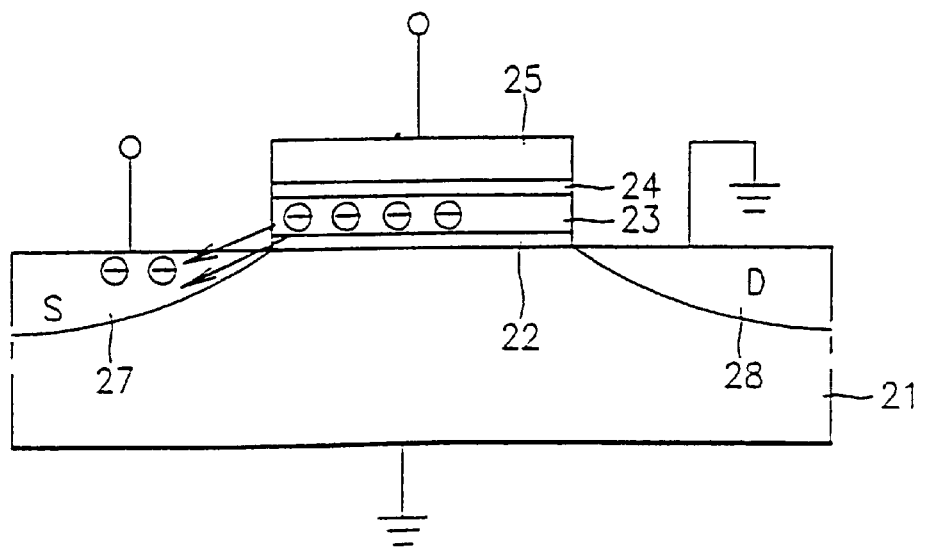
Figure 2A:
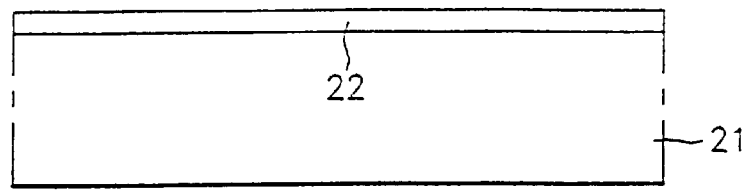
FIGS. 2a to 2f are cross-sectional views for illustrating a method of manufacturing the conventional flash memory device of FIG. 1.
Figure 2B:
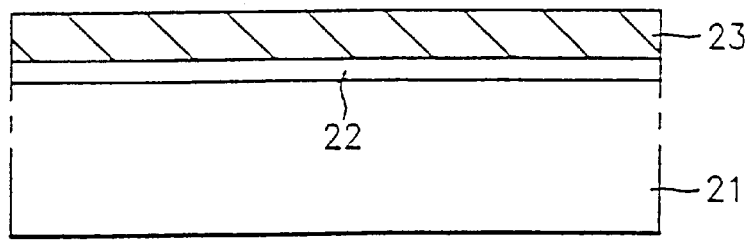
Figure 2C:
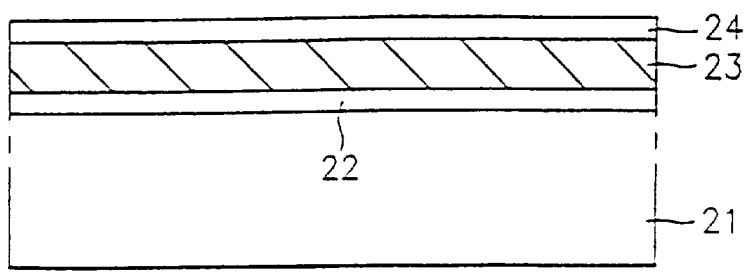
Figure 2D:
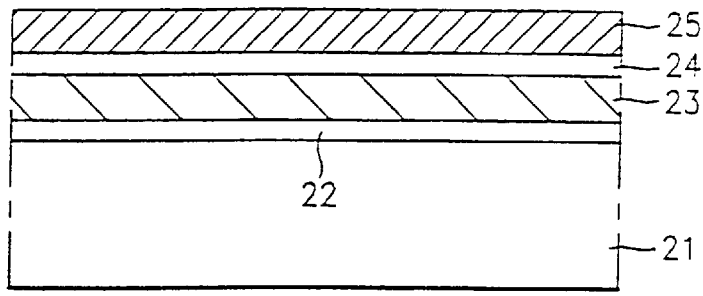
Figure 2E:
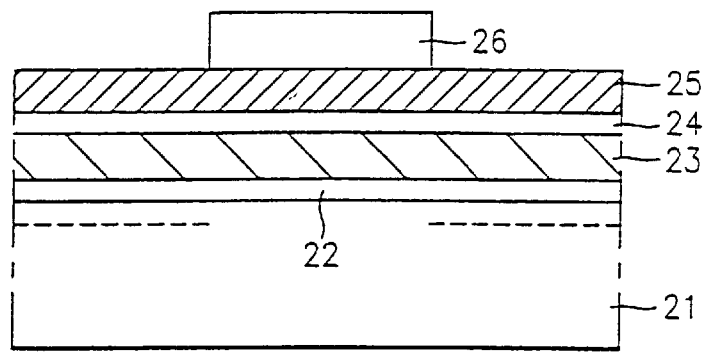
Figure 2F:
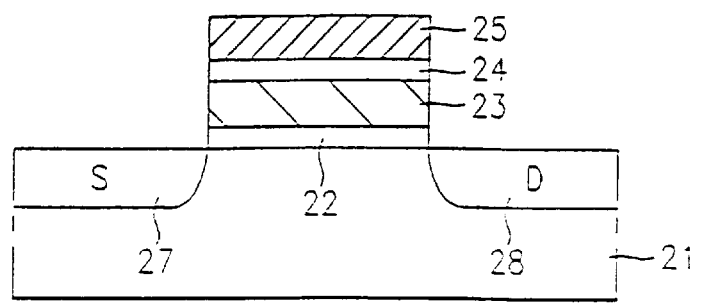
Figure 3A:
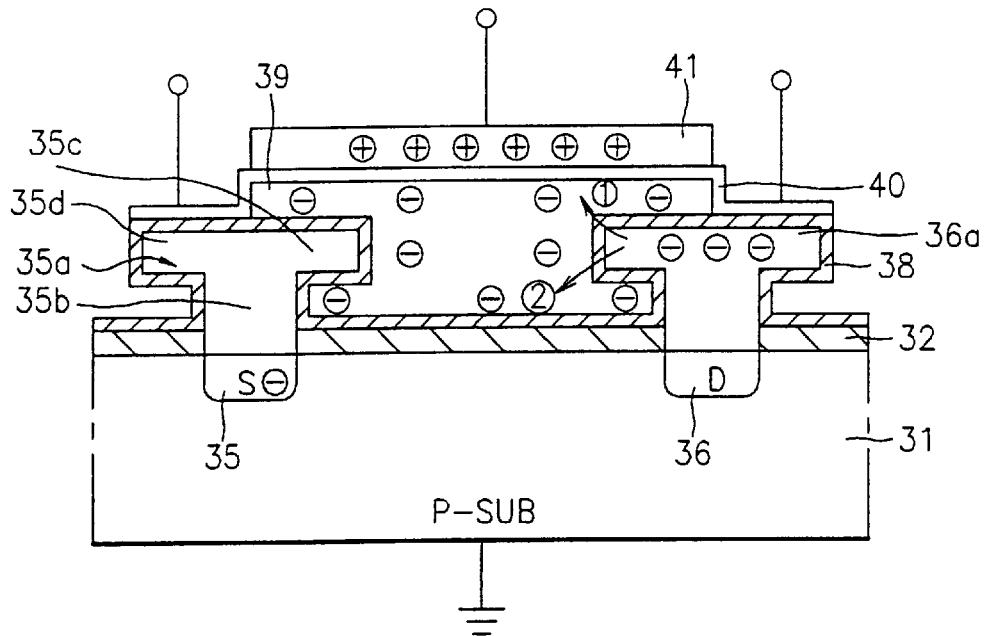
FIGS. 3a and 3b are cross-sectional views showing writing and erasing operations, in accordance with the present invention.
Figure 3B:
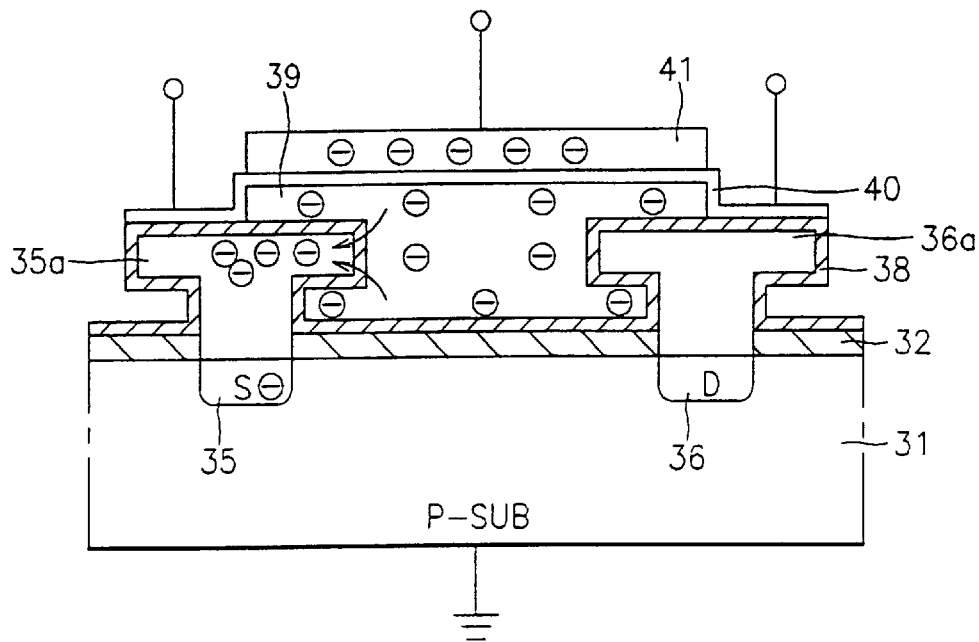

FIGS. 3a and 3b are cross-sectional views of a flash memory device, illustrating the writing and erasing operations, in accordance with the present invention. As shown, the flash memory device of the present invention includes a substrate 31 having source and drain impurity regions 35,36 therein, and source/drain electrodes 35a, 36a of a T-shaped rail structure being in contact with the source and drain impurity regions 35, 36, respectively. A floating gate 39 of an I-shaped rail structure commonly overlaps the source and drain electrodes 35a, 36a and is formed between the source and the drain regions 35 and 36. A control gate 41 is formed on the floating gate with an insulating layer 40 imposed therebetween.

In this example, substrate 31 is formed of a P-type polysilicon and source electrode 35a, drain electrode 36a, floating gate 30 and control gate 41 are formed of an N-type polysilicon. Source electrode 35a and drain electrode 36a may be formed at symmetrical locations or unsymmetrical locations to left and right, centering around floating gate 39. The T-shaped rail structure of source electrode 35a includes a first portion 35b, a second portion 35c, and a third portion 35d. The first portion 35b protrudes above a surface of substrate 31. The second and third portions 35c and 35d protrude from sides of first portion 35b. For example, second and third portions 35c and 35d protrude outwardly, substantially parallel with a surface plane of substrate 31. Further, first, second and third portions 35b, 35 and 35d include pointed corners of, for example, 90 degree angle. Further, the I-shaped rail structure of floating gate 39 is a result of the sides having an inverse contour of the shape of the source and drain electrodes 35a and 36a. As can be appreciated, the type of conductivity, the location and the shape may be readily modified in accordance with one of ordinary skill in the art from the teachings of the present invention.

With reference to FIG. 3a, the writing operation is as follows. The substrate 31 is grounded and a voltage of "0" volt is applied to source electrode 35a, and a voltage higher than the minimum voltage for writing is applied to control gate 41. By the potential difference between the voltage of drain electrode 36a and the voltage of control gate 41, a strong electrical field is created at the edge parts of floating gate 39 and drain electrode 36a such that hot electron carriers are programmed or injected into floating gate 39 from drain electrode 36a through thin insulating layer 38 (serving as an interpoly dielectric layer) by Fowler Nordheim type tunneling mechanism.

For an erasing operation, substrate 31 is grounded and drain electrode 36a is left floating. A negative (−) voltage higher than the minimum voltage at which erasing begins is applied to control gate 41, and a proper voltage for erasing is applied to source electrode 35a. See FIG. 3b. Accordingly, by the voltage applied to control gate 41 and the voltage applied to source electrode 35a, the threshold voltage of the memory cell transistor is lowered. The electrons programmed or injected into floating gate 39 are discharged to source electrode 35a by Fowler Nordheim type tunneling mechanism. Since I-shaped floating gate 39 overlaps source electrode 35a, erasing time is reduced. In other words, the contact area of source electrode 35a and floating gate 39 is increased to discharge more electrons in a shorter period of time.

The structure of the flash memory device in accordance with the present invention has various advantages over the related art. For example, even when a voltage lower than the voltage of the related art is applied, programming is possible. Further, a large number of electrons are discharged in a short period of time, thereby improving the erasing efficiency. The damage of the gate insulating film caused by hot electrons is also minimized to thereby improve the reliability of the memory cell.

Figure 4A:
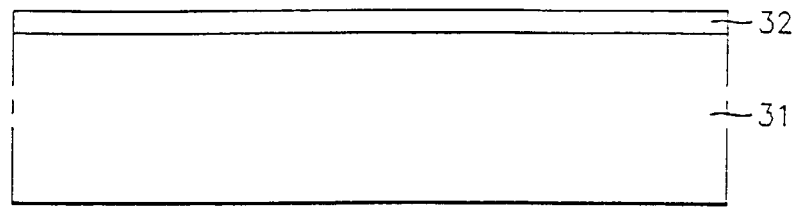
FIGS. 4a to 4g are cross-sectional views which illustrate a method of manufacturing the flash memory device, according to the present invention.
Figure 4B:
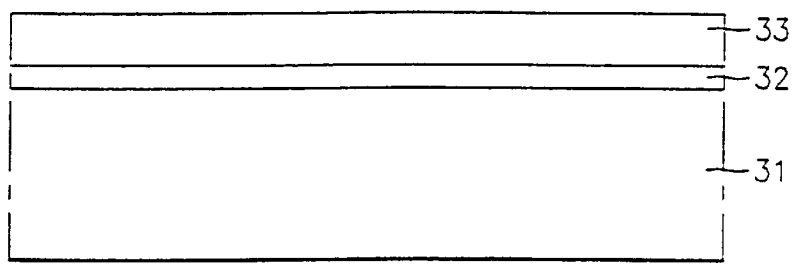
Figure 4C:
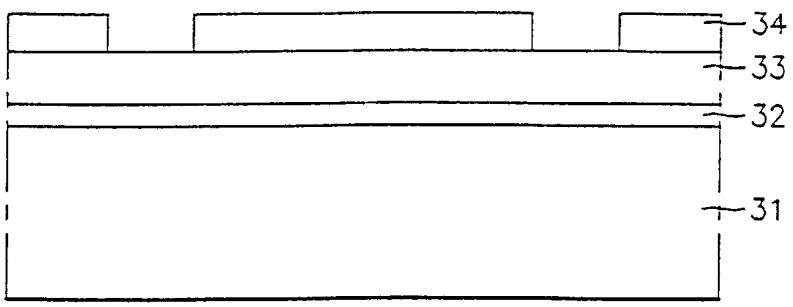

Hereinafter, a method of manufacturing the flash memory of the present invention will be described with reference to the cross-sectional views illustrated in FIGS. 4a to 4g. A first insulating layer 32 is formed on a semiconductor substrate 31 (FIG. 4a). A second insulating layer 33 is formed on first insulating layer 32 FIG. 4b) The thickness of first insulating layer 32 is about 300Å or more. First and second insulating layers 32 and 33 may be a nitride film or an oxide film. A photoresist 34 is coated on second insulating layer 33 and patterned by exposure and development process, thereby defining source and drain regions (FIG. 4c).

Figure 4D:
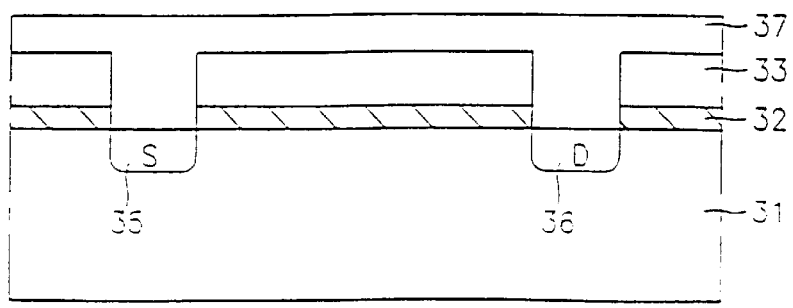

As shown in FIG. 4d, patterned photoresist 34 is used as a mask to selectively remove second insulating layer 33. An impurity ion implantation is carried out to form source and drain impurity regions 35 and 36 in substrate 31. First insulating layer 32 on each of source and drain impurity regions 35 and 36 is removed selectively. A first polysilicon layer 37 of an N-type conductivity is formed on the entire surface.

Figure 4E:
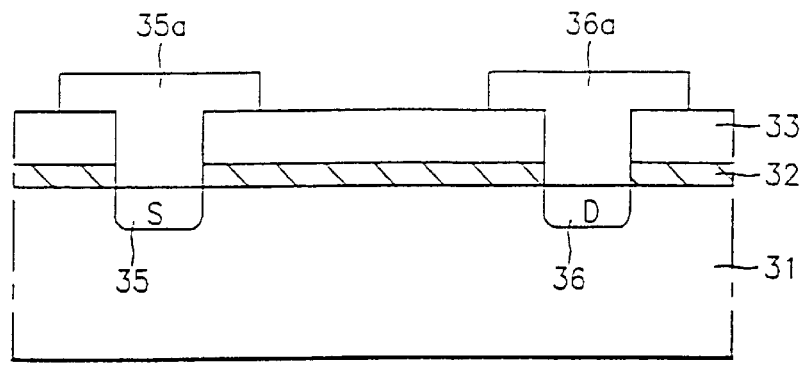
Figure 4F:
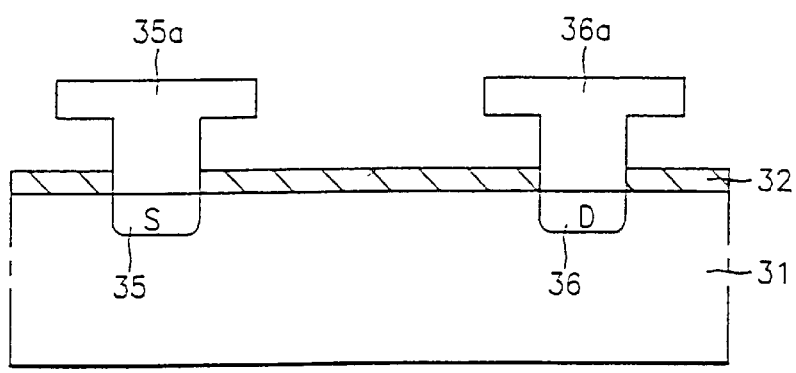

First polysilicon layer 37 is selectively removed to form source and drain electrodes 35a and 36a, where source electrode 35a and drain electrode 36a have a "T" structure (FIG. 4e). Second insulating layer 33 is removed by an etching process (FIG. 4f).

Figure 4G:
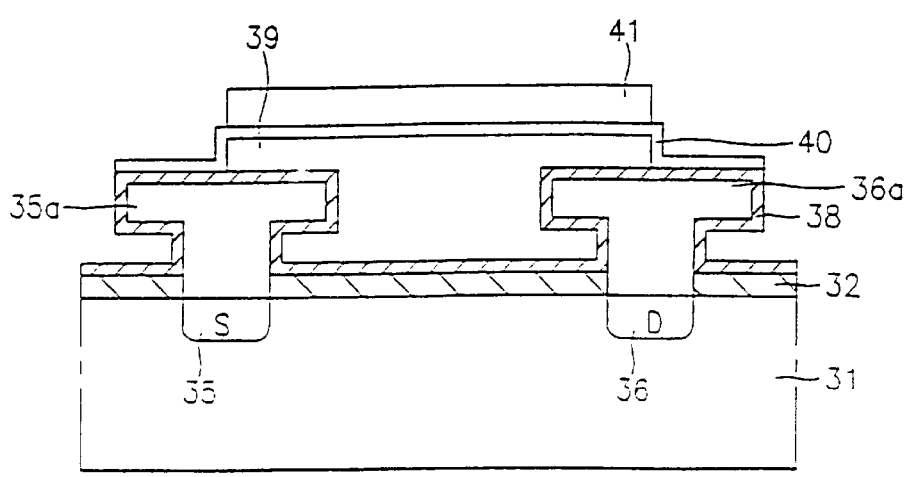

With reference to FIG. 4g, a third insulating layer 38 (serving as an interpoly dielectric layer) is formed on the entire surface including source electrode 35a and drain electrode 36a. Then, a second polysilicon layer of an N-type is formed on third insulating layer 38 and removed selectively to form a floating gate 39. Fourth insulating layer 40 is formed on the entire surface including floating gate 39 and removed selectively. Then, a control gate 41 of an N-type polysilicon is formed so as to have substantially the same width as the floating gate 39.

Figure 5A:
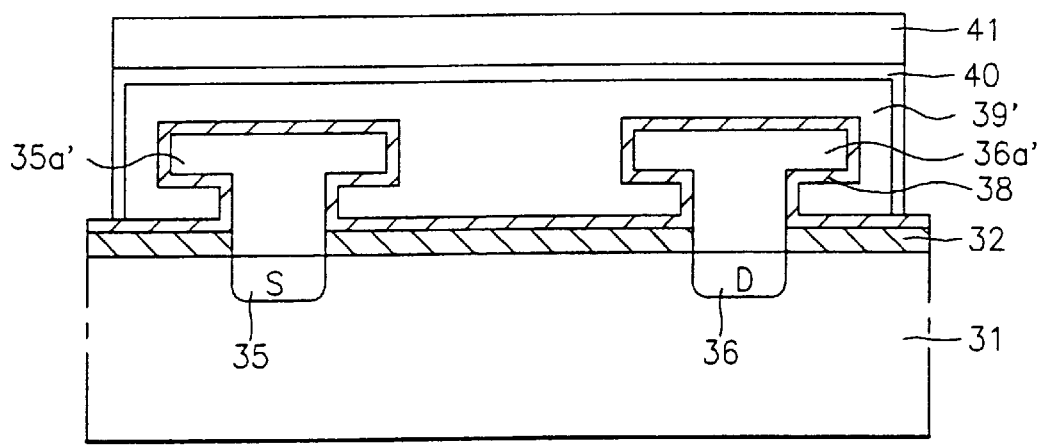
FIGS. 5a and 5b are different embodiments of the present invention.
Figure 5B:
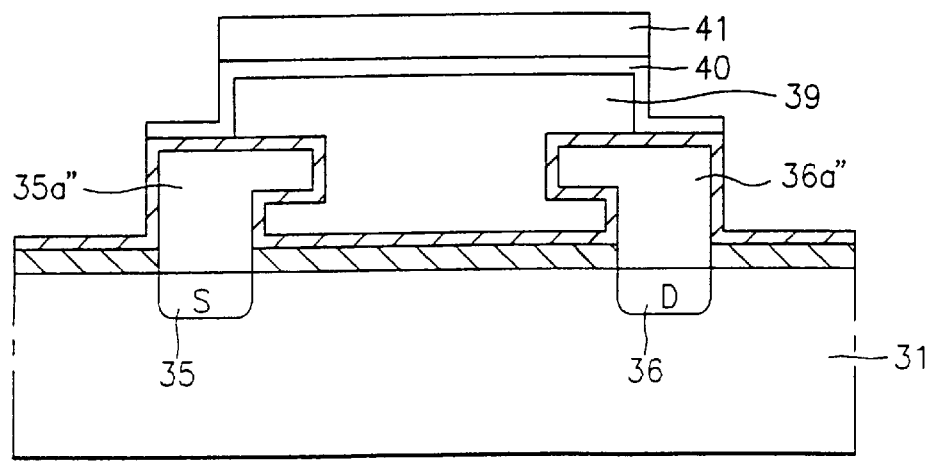

The foregoing embodiments are exemplary and are not to be construed as limiting the present invention. For example, the shape of the source and drain electrodes 35a and 35b and the floating gate 39 may be modified to achieve the object of the present invention in whole or in pat, as illustrated in FIGS. 5a and 5b. Further, pointed corners of about 90 degree angles are illustrated to achieve the tunneling. As appreciated, sharp surfaces and/or jagged edges may be used to achieve such tunneling. Moreover, the P-type conductivity or N-type conductivity of the illustrated embodiments may be readily interchangeable, and materials are not limited to polysilicon. The present teaching can be readily applied to other types of apparatuses. The description of the present invention is intended to be illustrate, and not to limit the scope of the claims. Many alternatives, modifications, and variations will be apparent to those skilled in the art.

What is claimed is:

1. A method of manufacturing a flash memory device comprising the steps of:
   forming a first insulating layer on a substrate of a first conductivity type;
   forming a second insulating layer on said first insulating layer;
   patterning said second insulating layer to form two open regions spaced apart from each other on said substrate;
   implanting an impurity in said substrate through said open regions to thereby form source and drain regions of a second conductivity type in said substrate;
   selectively removing said first insulating layer to expose said source and drain regions formed in said substrate;
   forming a first semiconductor layer of the second conductivity type in contact with said source and drain regions, on the surface of said remaining first and second insulating layers and in said open regions;
   patterning said first semiconductor layer to form source and drain electrodes of a T-shaped rail structure, and removing said remaining second insulating layer;
   forming a third insulating layer on exposed portions of the source and drain electrodes and the remaining first insulating layer including said source and drain electrodes;
   forming a second semiconductor layer of the second conductivity type on said third insulating layer;
   patterning said second semiconductor layer such that a floating gate of an I-shaped rail structure overlaps said source and drain electrodes;
   forming a fourth insulating layer on exposed portions of the second semiconductor layer and third insulating layer including said floating gate; and
   forming and patterning a third semiconductor layer on said fourth insulating layer to form a control gate.

2. The method of claim 1, wherein said first, second, third and fourth insulating layers comprises one of an oxide or a nitride.

3. The method of claim 1, wherein said first insulating layer has a thickness of about 300Å or more.

4. The method of claim 1, wherein said third insulating layer is an interpoly dielectric layer.

5. The method of claim 1, wherein said floating gate and control gate comprises an N-type polysilicon.

6. The method of claim 1, wherein said first, second and third semiconductor layers comprise polysilicon.

7. The method of claim 1, wherein said source and drain electrodes comprises a P-type polysilicon.

8. A method of forming a semiconductor device comprising the steps of:
   forming first and second regions in a substrate of a first conductivity type, said first and second regions being a second conductivity type;
   forming first and second electrodes coupled to said first and second regions;
   forming a first gate of an I-shaped rail structure overlapping portions of said first and second electrodes, said first gate being insulated from the overlapped portions; and
   forming a second gate overlapping and insulated from said first gate.

9. The method of claim 8, wherein said step of forming first and second regions includes the steps of:
   forming a first insulating layer on said substrate;
   forming a second insulating layer on said first insulating layer;
   patterning said second insulating layer to form two open regions spaced apart from each other; and
   implanting dopants of the second conductivity type into said substrate through said open regions to form said first and second regions.

10. The method of claim 8, wherein the step for forming said first and second electrodes comprises:
   patterning an insulating layer on a substrate to form two open regions which expose said first and second regions;
   forming a semiconductor layer in said opening and remaining insulating layer; and
   patterning said semiconductor layer to form said first and second electrodes.

11. The method of claim 8, wherein the step of forming said first gate comprises:
   forming an insulating layer on said first and second electrodes;
   forming a semiconductor layer on said insulating layer; and
   patterning said semiconductor layer to form said first gate, wherein portions of at least one of said first and second electrodes are overlapped by said first gate.

12. The method of claim 8, wherein the step of forming said second gate comprises:
   forming an insulating layer on said first gate;
   forming a semiconductor layer on said insulating layer; and
   patterning said semiconductor layer to form said second gate.

13. The method of claim 8, wherein at least one of said first and second electrodes has a T-shaped rail structure.

14. The method of claim 8, wherein at least one of said first and second electrodes includes a first portion protruding above a surface of said substrate, and a second portion protruding from a first side of said first portion, at least one of said first and second portions having at least one of pointed corners, sharp surfaces and jagged edges.

15. The method of claim 8, wherein at least one of said first and second electrodes includes at least one of pointed corners, sharp surfaces and jagged edges.

16. The method of claim 8, wherein said first gate has a prescribed shape including at least one of pointed corners, sharp surfaces and jagged edges.

17. The method of claim 8, wherein said first gate has at least one surface contour which is an inversed contour of a surface of at least one of said first and second electrodes.

* * * * *